United States Patent [19]

Bordui et al.

[11] Patent Number: 5,310,448
[45] Date of Patent: May 10, 1994

[54] COMPOSITION FOR GROWTH OF HOMOGENEOUS LITHIUM NIOBATE CRYSTALS

[75] Inventors: Peter F. Bordui, Menlo Park; Richard G. Norwood, San Jose; John L. Nightingale, Woodside, all of Calif.

[73] Assignee: Crystal Technology, Inc., Palo Alto, Calif.

[21] Appl. No.: 236,960

[22] Filed: Aug. 26, 1988

[51] Int. Cl.$^5$ .............................................. C30B 29/30
[52] U.S. Cl. ..................................... 423/593; 117/13; 117/35; 117/948
[58] Field of Search ...................... 423/593; 156/617.1, 156/DIG. 71, DIG. 87

[56] References Cited

U.S. PATENT DOCUMENTS 3,528,765  9/1970  Fay et al. ..................... 156/DIG. 87
3,607,752  9/1971  Graencher .................. 156/DIG. 87

FOREIGN PATENT DOCUMENTS 61-53200  3/1986  Japan .
62-78197  4/1987  Japan .

OTHER PUBLICATIONS

Japanese Patent Document (English–language abstract only) No. 61-53200; Hamamatsu Photonics K.K.; Mar. 17, 1986. (Patent Abstracts of Japan, vol. 10, No. 214 (C-362) Jul. 25. 1986.)
"Characterization of LiNbO3 Single Crystals by X-ray Topography", Sugii et al., Review of the Electrical Communication Laboratories, vol. 23, Nos. 5-6, May--Jun. 1975 pp. 569-580.
Ballman et al Curie Temperature and Birefringence Variation in Ferroelectric Lithium Metatantalate as a Function of Melt Stoichiometry, J. American Ceramic Society vol. 50 #12, Dec. 1967 pp. 657-659.
Holman et al, Chemical control of optical damage in lithium niobate, Appl Phys Letters vol. 32(5) Mar. 1978 pp. 280-283.
O'Bryan et al., Congruent Composition and Li-Rich Phase Boundary of LiNbO3 J. Amer. Ceramic Soc. vol. 68(9) Sep. 1985 pp. 493-496.
Chow et al The Congruently Melting Composition of LiNbO3 Mat Res Bull vol. 9 1974 pp. 1067-1072.
Carruthers et al, Nonstoichiometry & Crystal Growth of Lithium Niobate.
Lerner, Stoechiometrie des Monocristaux de Metaniobate de Lithium, J. Crystal Growth vol. #4, 1968 pp. 231-235.
Byer Growth of High Quality LiNbO3 Crystals from Congruent Melt, J. Applied Physics vol. 41 #6 May 1978 pp. 2320-2325.
Shigematsu et al, Growth Conditions of Subgrain Free LiNbO3 Single Crystals by the Czochralski Method, Jap. J Applied Physics vol. 26 #12 Dec. 1987 pp. 1988-1996.
Nash et al, Effect of Optical Inhomogeneities on Phase Matching in Nonlinear Crystal, J. Applied Physics vol. 41 #6 May 1976 pp. 2564-2576.

Primary Examiner—John Doll
Assistant Examiner—Robert M. Kunemund
Attorney, Agent, or Firm—Joseph S. Codispoti

[57] ABSTRACT

A new compositional relationship in the starting charge of a crystal growth station (FIG. 1 ) provides homogeneous monocrystalline lithium niobate. A new measurement system (FIG. 2 ) provides Curie point values of significantly greater accuracy then that of conventional measurements. Careful control of the starting charge composition for crystal growth and effective utilization of the measurement system enable the determination of the compositional range of starting charges for producing congruent crystalline production. The composition corresponds to a mol percentage of 48.35±.01 to 48.40±.01 of $Li_2O$ and the remainder $Nb_2O_5$ for producing homogeneous crystal whose solidification fraction of the molten charge exceeds that which was heretofore achievable.

16 Claims, 4 Drawing Sheets

FIG. 3

| COMPOSITION (MOL%Li$_2$O) | CURIE TEMPERATURE (°C) TOP OF CRYSTAL | CURIE TEMPERATURE (°C) BOTTOM OF CRYSTAL | DIFFERENCE (°C) |
|---|---|---|---|
| 48.30 | 1142.1 | 1141.0 | -1.1 |
| 48.35 | 1142.2 | 1142.1 | -0.1 |
| 48.38 | 1142.3 | 1142.3 | 0.0 |
| 48.40 | 1143.4 | 1143.5 | 0.1 |
| 48.45 | 1143.5 | 1144.7 | 1.2 |
| 48.53 | 1143.3 | 1145.2 | 1.9 |
| 48.60 | 1144.8 | 1151.5 | 6.7 |

| COMPOSITION (MOL%Li$_2$O) | CURIE TEMPERATURE (°C) TOP OF CRYSTAL | CURIE TEMPERATURE (°C) BOTTOM OF CRYSTAL | DIFFERENCE (°C) | MELT FRACTION BETWEEN SAMPLES |
|---|---|---|---|---|
| 48.375 | 1142.2 | 1140.5 | -1.7 | 0.90 |
| 48.385 | 1142.1 | 1143.0 | 0.9 | 0.80 |

COMPOSITION FOR GROWTH OF HOMOGENEOUS LITHIUM NIOBATE CRYSTALS

BACKGROUND OF THE INVENTION

This invention relates to the manufacture of crystalline materials primarily for acoustic and optical applications, and it relates, more particularly, to the formation of homogeneous crystals in an improved process wherein substantially all of the liquid material is efficiently converted into crystalline material of spatially uniform properties throughout its volume.

The useful properties of single crystalline lithium niobate, such as associated with its energy transmissive crystal structure and piezoelectric nature, have long been recognized and are responsible for extensive and widespread applications for sometime. Although often noted as "LiNbO$_3$", the lithium niobate phase encompasses a relatively broad range of composition, with possible Li to Nb elemental ratios from roughly 44 to 50 mol % Li. Due to the rather adaptive nature of the dynamic, complex, crystal growing process for forming such crystalline material, efficiency of production and uniformity of product have until now continued to elude crystal growers.

Lithium niobate is typically prepared in single crystal form by pulling crystals in the well-known Czochralski process. Single crystal boules as large as 10 kg have been prepared in this way.

Central to any solidification process, including the Czochralski process, is the concept of "congruency". A liquid is considered to solidify "congruently" if, on cooling, it produces a solid of exactly the same composition as the liquid. By contrast, in incongruent solidification, the solid forming at any time has a composition different from that of the immediately adjacent freezing liquid. The consequence is rejection of some chemical component from the solidification front back into the liquid. As solidification progresses, this rejection effects a gradual enrichment of the liquid by the rejected species which in turn results in spatial variation of the chemical composition of the resulting solidified body. As a result, the failure to begin with the exact "congruent" composition drives the liquid phase composition even further away from the correct composition which makes it impossible to produce crystals of spatial uniformity in a high yielding process.

In a practical production process for single crystalline material of a given phase, congruent solidification, if possible, is generally preferred to incongruent solidification largely for two reasons. First, from a crystal production standpoint, a congruent solidification process is generally more efficient. Due to the rejection phenomena going on at an incongruent solidification front, conventional growth rates must be kept relatively low to avoid interfacial breakdown effects that would otherwise result in a highly defective product. Also, due to the build-up of rejected species in the liquid as incongruent solidification progresses, the fraction of a given volume of liquid that can be successfully crystallized is limited. In addition, the spatial variation in composition in a crystal grown incongruently may also result in spatial variation of its thermal expansion properties. As a consequence, there is a tendency to crack on subsequent cooling.

Second, from the standpoint of using fabricated crystalline material in construction of electronic, optical, or acoustic devices, a congruent solidification process yields more desirable material. Efficient production of high-performance crystal-based devices to tight design tolerances requires high uniformity in critical crystal material properties, both within individual pieces and from piece to piece. Generally, such uniformity in critical material properties in turn requires uniformity in crystal composition. Clearly, a congruent solidification process favors such uniformity in crystal composition.

The subject of congruency as it relates to lithium niobate Czochralski growth has been a rather confused issue from the earliest work on the material. In large part, difficulty in resolving the confusion has been due to the practical difficulty in measuring to necessary precision the chemical composition of crystalline lithium niobate. Due to the extremely low solubility of solid lithium niobate in common acids, standard wet-chemical analytical techniques are relatively imprecise. Potentially more accurate techniques like Curie temperature measurement and non-linear optical phase-match temperature measurement are rather subtle in their application.

Initial lithium niobate growth work was based on the belief that the congruent composition should be a Li:Nb ratio of 50 mol % Li. In 1968 Lerner et al. in the Journal of Crystal Growth $\frac{3}{4}$ (1968) 231 reported the congruent composition to lie between 48 and 49 mol % Li. Later, Carruthers et al. in the Journal of Applied Physics 42 (1971) 1846 reported the congruent composition as 48.60 mol % Li. In 1974, Chow et al., Mat Research Bull. 9 (1974) 1067 determined that the congruent composition lies between 48.50 and 48.60 mol % Li. In 1985, O'Bryan et al. in the Journal of the American Ceramic Society 68 (1985) 493 reported the congruent composition as 48.45 mol % Li. Most recently, in Applied Physics Letters 53 (1988) 260 Wen et al. made an uncited reference to a congruent composition value of 48.71 mol % Li.

Obviously, not all of the foregoing conflicting reports on congruent compositions can be correct. Moreover, each of these studies is open to serious doubt, due to one or more of several shortcomings. Primarily, these drawbacks are:

(1) Inaccuracy or imprecision in compositional measurement technique, (2) Growth of crystals representing total melt fractions smaller than desirable for maximizing effects of incongruency, (3) Compositional characterization of specimens inappropriately large with respect to the size of the parent crystals being analyzed, and (4) Analysis of measurement results based on dubious extension of approximate theoretical construction.

If one were to take as an illustration the recent work by O'Bryan et al., these people skilled in the art based an analysis of a preferred lithium niobate growth composition on compositional measurements they performed on both fabricated crystalline specimens cut from lithium niobate crystals and solidified polycrystalline samples withdrawn from the corresponding melts used in crystal growth. The compositional measurements were performed using a differential thermal analysis (DTA) technique to determine the ferroelectric Curie temperature of each of the samples. It is also significant to note that the fraction of liquid crystallized only corresponded to 0.72 of the melt.

The precision on the Curie temperature measurements of O'Bryan et al. was quoted as ±2°C. Such precision in Curie temperature measurement corresponds to a roughly ±0.2 mol % Li precision in specifying melt composition for growth. It is generally known and is confirmed in data and discussion presented hereinafter that such wide error bars associated with specifying melt composition are unable to provide a significant improvement in lithium niobate crystal production beyond present conventional commercial practices of those skilled in the art.

SUMMARY OF THE INVENTION

It is one of the primary objects of the present invention in the solidification of lithium niobate to determine the true congruent relationship between melt composition and crystallized composition using measurement techniques and crystal growth techniques resulting in more accurate material characterization over that of conventional crystal growth processes.

Another primary object of the invention is the formation of homogeneous crystals each having spatially uniform properties throughout its volume wherein substantially all of the melt is included in the crystalline material.

Other related objects are efficient solidification of crystalline lithium niobate in terms of speed, reproducibility, and consistency.

A further object is to enable the production of crystal boules of larger diameters and more uniform properties than conventional techniques.

A further object is to determine a compositional relationship between lithium and niobium producing congruent crystal growth for any axial orientation selected for homogeneous crystal growth.

A feature utilized in crystal growth technique is the solidification of large portions, 0.85 or more, of the melt for enhancing the effects of incongruency for insuring detection of its presence in cases where it would otherwise be not as distinct.

The invention takes the form of positive results of a controlled scientific experiment involving modification of the starting composition in a process for producing monocrystalline lithium niobate of uniform and reproducible properties by virtue of being homogeneous. All parameters of the process and measurement techniques were refined to the point of being compatible to yield reproducible and accurate measurements of the resulting crystalline material. In the course of determining the congruent composition, investigation was employed to arrive at the limits of a compositional range which would produce homogeneous crystalline lithium niobate under normal processing situations. Crystalline homogeneity provides unprecendented constancy of the properties of lithium niobate so as to improve its application as a substrate material in all conventional uses while also enhancing the production characteristics of the material itself.

In accordance with the invention, a melt solution comprising a composition range of 48.35±.01 mol percent to 48.40+.01 mol percent of $Li_2O$ with the remainder being $Nb_2O_5$ produced compositionally uniform crystalline material superior to conventional lithium niobate. In addition, the production of crystallized material corresponded to at least 0.85 of the melt solution which exceeds the output heretofore obtainable.

In a process for freezing homogeneous lithium niobate out of a melt solution on a crystal seed, a melt solution was prepared having a compositional range in terms of mol percent of $Li_2O$ of 48.375+0.010 to 48.385+0.010 with the remainder of the melt solution being $Nb_2O_5$. From this melt, production of crystalline material routinely corresponded to 0.95 of the melt solution.

The invention is based on the use of an accurately controlled lithium niobate liquid composition of 48.38 mol % Li to grow single crystals of solid lithium niobate better suited for optical and acoustic uses than conventionally grown crystals.

BRIEF DESCRIPTION OF THE DRAWING

Additional features of the invention and additional objects of the invention will be more readily appreciated and better understood by reference to the following detailed description which should be considered in conjunction with the drawing.

FIGS. 3 and 4 are tables listing measurement values.

FIG. 5 depicts a substrate of lithium niobate suitable for acoustic or optical applications.

DETAILED DESCRIPTION

Figure 1:
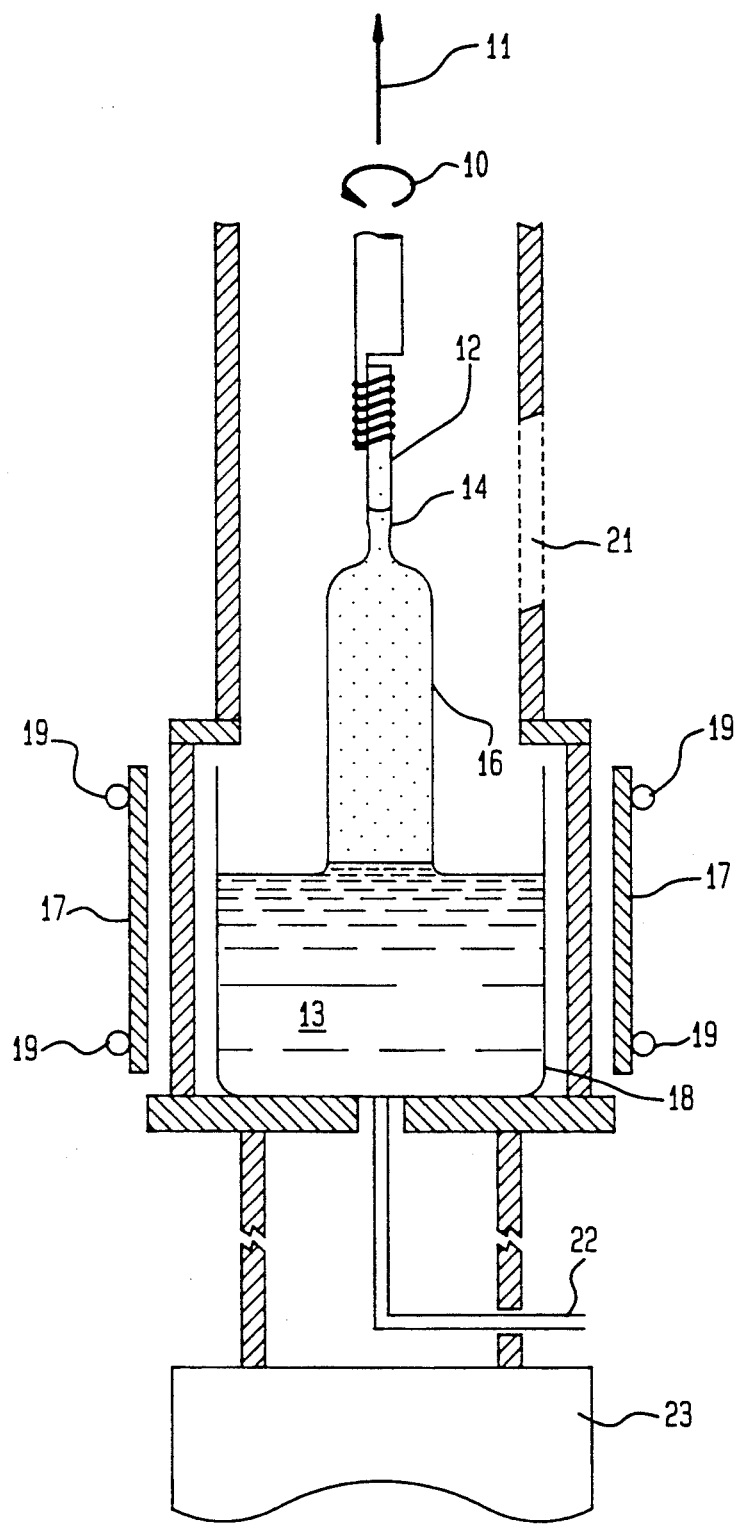
FIG. 1 is a schematic illustration of a Czochralski type crystal growth station.

Initial Compositional Preparation for Growth of Homogeneous Lithium Niobate Crystals A small sample was withdrawn from a roughly 100 kg barrel of high-purity $Li_2CO_3$ powder. This powder in the barrel had been previously sampled and characterized using thermal ionization mass spectrometry to establish an average atomic weight for the contained lithium of 6.942. The small sample was placed in a 21.900 g Pt (platinum) dish. An electronic balance was used to determine the combined mass of the dish and sample to be 33.573 g. The Pt dish and sample were placed in a muffle furnace at 500° C. in air for 10 minutes. On removal from the furnace, the dish and sample were allowed to cool in a dry-atmosphere glove box for 10 minutes. The dish and sample were re-measured on the balance and, in this case, found to have a mass of 33.506 g. A moisture loss correction factor of $(33.573-33.506)/(33.506-21.900)+1=1.0058$ was thus established for the $Li_2CO_3$ powder.

An analogous technique was applied to a barrel of high-purity $Nb_2O_5$ powder in establishing a moisture loss correction factor of 1.0002.

A 948.8+.05 g mass of powder was then withdrawn from the barrel of $Li_2CO_3$. Considering the measured atomic weight for Li, the moisture loss correction factor of 1.0058, and the expected evolution of $CO_2$ gas on reaction, this 948.8+.05 g mass of powder was determined to amount to 381.48±.02 g of $Li_2O$ to be contributed to an $Li_2CO_3/Nb_2O_5$ powder mix that was subsequently reacted to form a charge of lithium niobate.

A 3619.7±.05 g mass of powder was now withdrawn from the barrel of $Nb_2O_5$. Considering the moisture loss correction factor of 1.0002, this 3619.7±.05 g mass of powder was determined to amount to 3619.0±.05 g of $Nb_2O_5$ to be contributed to the aforementioned powder mix.

The $Li_2CO_3$ and $Nb_2O_5$ powder masses were combined in a powder blender and mixed for 30 minutes. The mixed powders were placed in a Pt crucible and reaction-melted in a furnace at roughly 1300° C. The molten charge was poured into a smaller Pt crucible and allowed to solidify. Through previous quantitative experimental analysis of the extent and chemical nature of volatilization losses associated with this process, it had been established that reaction-melting of the powder mix would result in a preferential loss of $0.15\pm.12$ g of $Li_2O$. It should be noted that the uncertainity in this last value is predominantly systematic and not random. Thus, this uncertainity has an impact predominantly on the absolute accuracy, as opposed to the reproducibility, of compositional specification.

The resulting $381.33+.14$ g mass of $Li_2O$ and the $3619.0+.05$ g mass of $Nb_2O_5$ are thus in a ratio such that $(Li_2O/(Li_2O+Nb_2O_5))\times 100=48.380\pm.01$. This value of 48.380 was the composition of the charge from which a crystal was drawn.

Growing the Crystal

The smaller crucible containing the solidified charge was placed appropriately in a typical Czochralski crystal growth station. The station was heated, the charge was melted, and then a lithium niobate crystal measuring roughly 8 cm in diameter by 12 cm in length was grown.

FIG. 1 is a schematic diagram of a typical conventional Czochralski station. Such a station appears in Chapter 4 in J. C. Brice's Crystal Growth Processes (Blackie & Son, Glasgow, 1986). Crystal rotation indicated by arrow 10 has a rate range between five and fifty revolutions per minute. Growth rates range between 0.3 and 0.7 cm/hour whose direction is indicated by arrow 11. The growing process starts with a crystal seed 12 tied into a V-groove. The seed 12 is placed in contact with melt 13 and drawn upward while rotating. First, a neck 14 is produced and then the boule 16 of useable crystal forms. The melt 13 is heated by radio frequency coil 17 (or resistance heating) in a platinum crucible 18. Water cooling 19 is also used to provide a controlled thermal load. The process may be monitored visually through viewing slot 21 as well as by thermocouple 22 and weight transducer 23. The growth process consumes about sixty-eight hours from initial heat-up to harvest of the grown crystal.

After the furnace was cooled and the crystal removed, samples were cut out from near each end of the crystal. The samples measured $1\times 1$ cm square by 2 mm thick, with the thickness in the crystallographic Z direction.

Figure 2:
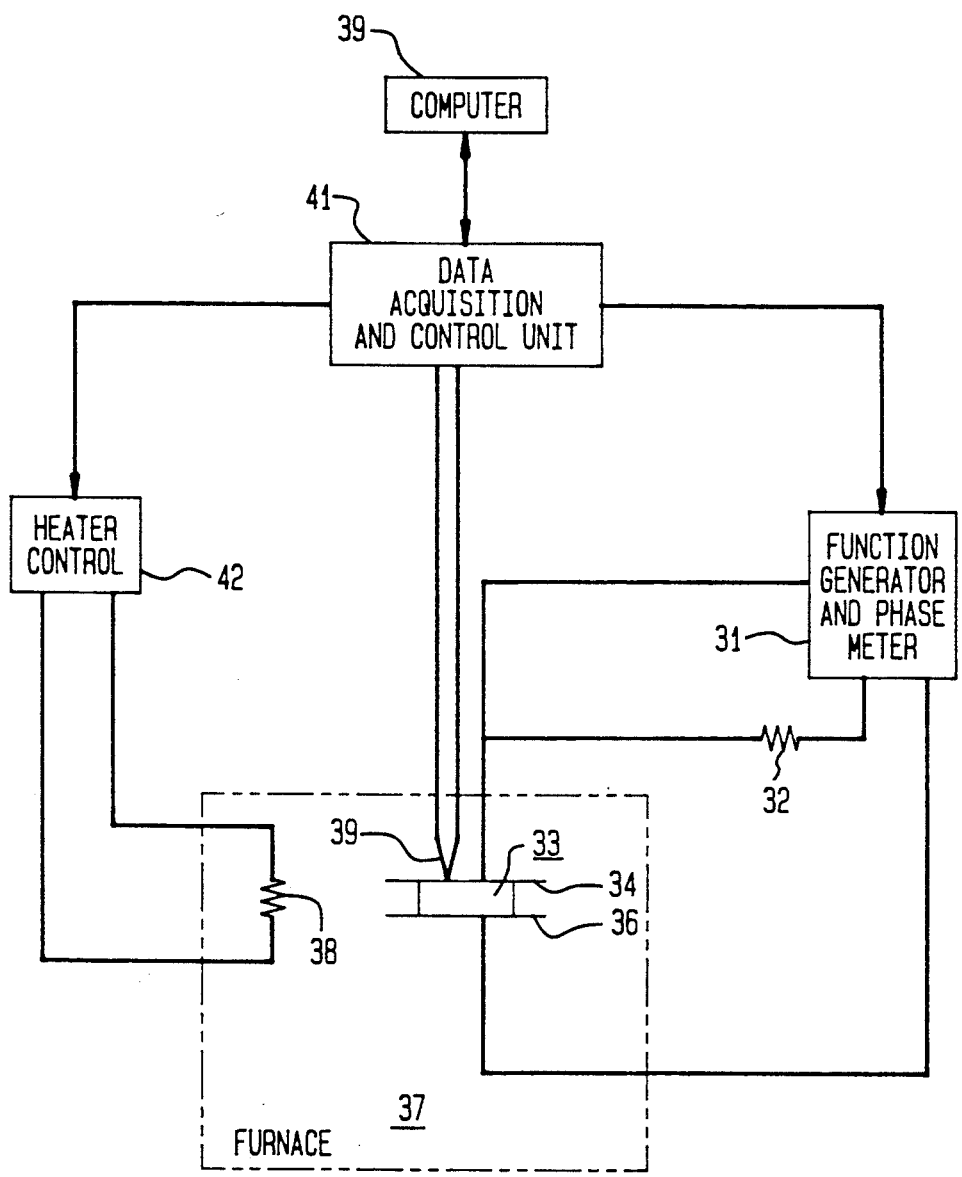
FIG. 2 provides an overall diagram of the measurement system for determining the ferroelectric Curie transition of lithium niobate produced by the inventive process.

Using the Curie point measurement system illustrated in FIG. 2, these samples were each determined to have a ferroelectric Curie transition temperature of $1142.3+0.3°$ C.

Curie Point Measurement of Crystal Composition

The historical basis for the invention was the development of a highly accurate and efficient system for measuring lithium niobate crystal composition, originally undertaken for use in lithium niobate crystal production quality control. The system is based on identification of the dielectric effects of the ferroelectric Curie transition that occurs in lithium niobate at temperatures between roughly 1100 and 1250° C., the exact temperature dependent on the value of the Li:Nb ratio.

FIG. 2 is an overall schematic diagram of the measurement system. In essence, a phase meter 31 records the phase offset between two legs of an AC signal. One leg passes through a reference resistor 32, the other leg through the crystal sample 33 being measured. The sample is mounted between thin platinum plate contacts 34 and 36 in a small, controllable furnace 37 which has a resistance heater 38. Four calibrated thermocouples (symbolically represented by one thermocouple 39) are held in contact with the platinum plates 34 and 36 via a spring-loaded assembly (not shown). As the temperature of the furnace is cycled, the phase meter 31 records a sharp maximum in the AC phase offset between the two circuit legs as the sample 33 passes through its ferroelectric/paraelectric Curie transition. Such maxima occur on both heating and cooling cycles. Phase offset maxima and corresponding thermocouple readings are recorded through use of a digital data acquisition unit. Operation of the entire measurement system is coordinated by a programmed desktop computer 39. Specifically, computer 39 analyses the data and directs control unit 41 to act by coordinating the operation of heater control 42 of furnace 37 and that of function generator and phase meter 31. Although the concepts underlying the measurement system are in themselves not novel, their particular employment in the system of FIG. 2 enables unprecedented precision and accuracy in measuring lithium niobate Curie temperatures. Through adjustment of the AC frequency, typically on the order of 1 MHz, the phase effect can be maximized to yield a sharp, reproducible peak. Owing to the intensity and sharpness of the phase offset peak, slow ramping of the furnace temperature measurements, on the order of 1° C./minute, is now feasible for Curie measurements. By contrast, in the case of DTA-based Curie temperature measurements such as performed in the earlier-cited work of O'Bryan et al., the relative weakness of the thermal signal associated with the ferroelectric-paraelectric Curie transition necessitates a temperature ramping rate in the range of at least 20° C./minute.

The lower temperature ramp rate possible in the present system enables higher resolution in the thermocouple-based temperature measurement, on the order of 0.1° C. Further, through use of four thermocouples positioned against either face of the sample and an adjustable sample holder, the system can be tuned for a given sample size to achieve sample placement in the thermal center of the furnace, thereby minimizing thermal gradient effects and maximizing absolute temperature measurement accuracy. Absolute accuracy of a Curie temperature measurement using the system is better than $\pm 0.3°$ C. Reproducibility of a given measurement is better than $\pm 0.1°$ C. These values of accuracy represent at least seven times greater precision than historically reported for such measurements on lithium niobate.

Summary of Experiments Performed

In an initial phase of the effort to identify the lithium niobate congruent composition, the Curie point measurement system was used to analyze crystals grown from a variety of starting compositions, including compositions mentioned in above-noted publications. Sixteen crystals were grown and analyzed in this effort. These crystals have a cylindrical shape roughly of 8 cm in diameter by approximately 13 cm in length, each representing at least 85% of about a 4 kg liquid charge. The use of such large crystals was purposely made to minimize compositional ambiguities associated with finite measurement sample size. Large melt fractions were crystallized in order to maximize the effects of any incongruency. As implied by above discussion, extensive effort was devoted to proper treatment of issues such as moisture incorporation in starting chemicals, incongruent volatilization during liquid charge preparation and crystal growth, and variability in starting chemical isotopic ratios, that, if ignored, could lead to compositional inaccuracy.

In FIG. 3, the table summarizes the results of this initial phase. The intervening material between the top and bottom Curie point samples from each crystal represented in each case a melt fraction of roughly 0.70. The more uniform the Curie temperature from one end of a crystal to the other, the closer to congruency was the solidification process by which it was produced. Based on the data collected, the preferred composition for lithium niobate crystal growth appears to be roughly 48.38 mol % Li. Further, within the limits of Curie point measurement precision, and for a 0.70 melt fraction crystallized between top and bottom samples, both 48.35 and 48.40 mol % Li charge compositions appeared to yield compositionally uniform crystalline material.

The Curie point based results presented in FIG. 3 were corroborated through measurement of the phase-match temperatures for second harmonic generation of a 1.06 micron Nd:YAG laser beam. In a manner similar to the Curie point measurements, phase match temperature uniformity from one end of a crystal to the other indicates congruency of the solidification process.

A second phase of the effort to identify the lithium niobate congruent composition was directed toward the compositional region in the vicinity of 48.38 mol % Li. In this phase, crystals of tightly controlled compositions on either side of 48.380 mol % Li were grown to unprecedented melt fractions to amplify effects of incongruency to enable the Curie point measurement technique to more finely resolve the congruent composition.

Crystals were grown from melt compositions of 48.375±.010 mol % Li and 48.385+.010 mol % Li. The crystals represented sufficiently large melt fractions that intervening material between top and bottom Curie point samples represented melt fractions of at least 0.80.

Figures 4, 5:
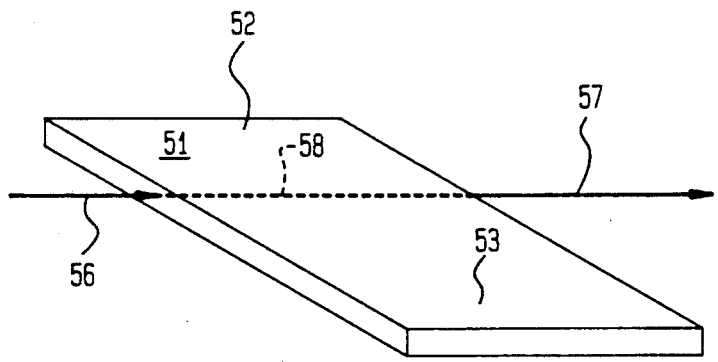

In FIG. 4, the table summarizes the results. The Curie point measurements indicate the 48.375 composition to be on the lithium poor side of congruency with the 48.385 composition on the lithium rich side. Considering that, as noted above, the majority of the ±.010 mol % Li uncertainity in specifying the composition of the 48.375 and 48.385 boules is systematic and not random, it may be conservatively concluded that the congruent composition for lithium niobate crystallization is 48.380+.015 mol % Li.

It should be noted that this value of 48.380 mol % Li for the lithium niobate congruent composition is neither indicated nor implied as being preferred by any prior art papers.

Further work was devoted to analysis of crystal production yield using the 48.38 mol % Li composition. Seventy crystals were grown over a period of roughly eight months in this effort. Crystals ranged from 8 to 13 cm in diameter and from 7 to 15 cm in length. All crystal orientations common in lithium niobate commercial crystal production were used. Solidified melt fractions were as high as 97%.

Ten of these crystals were analyzed using the Curie point measurement system. In all cases, within the limits of measurement precision, Curie point variation was undetectable, both within spatially displaced locations of any given crystal and from crystal to crystal in the series.

Moreover, based on twenty year's accumulation of data on lithium niobate crystal growth production yield, the 48.38 mol % Li charge composition enables unprecendented Czochralski growth production efficiency, in terms of both achievable growth rate and achievable crystallized melt fraction.

FIG. 5 illustrates a typical substrate 51 of homogeneous lithium niobate formed in accordance with the inventive principles. In order to form substrates, the lithium niobate boule is first sawed into slices. Then, the slices are polished to remove mechanical damage of the sawing operation and to obtain the desired thickness for the substrates. Finally, the slices may be divided into the individual substrates which may occur after the device processing procedure. Due to the homogeneity of the material, substrate 51 is better suited for acoustic or optical applications since all of its pertinent properties will have constant values.

In accordance with traditional acoustic applications, transducers (not shown) may be located at points 52 and 53. In this case, the transducers would be selected in accordance with providing a desired transfer function between the transducers. In accordance with an integrated optics application, a light beam 56 impinges on the side of the substrate 51 and propagates along path 58 before exiting as light beam 57. It is to be understood that along path 58 various electrodes and/or diffusion patterns may be made to achieve the desired function for substrate 51 as an integrated optic device.

There has thus been shown and described a novel process for forming homogeneous lithium niobate which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. In addition to the modifications already mentioned or alluded to in the foregoing, the starting composition may be used to advantage in other types of growth stations. Due to the constancy of the properties of the crystalline material, further applications of lithium niobate may result. All such changes, modifications, variations and other uses and applications which do not depart from the spirit and scope of the invention are deemed to be covered by the invention which is limited only by the claims which follow.

We claim:

1. Lithium niobate acoustic surface wave material produced by: a) preparing a charge of lithium niobate having a mol percentage composition of $Li_2O$ of about 48.38 and the remainder $Nb_2O_5$, b) heating the charge to a temperature to provide a molten charge, and c) drawing a solidifed homogeneous crystal from the molten charge having a composition essentially the same as that of the molten charge.

2. The acoustic surface wave material of claim 1, wherein the step of c) comprises pulling the solidified homogeneous crystal to obtain a solidification fraction for the homogeneous crystal corresponding to at least 0.85 of the molten charge.

3. Lithium niobate acoustic surface wave substrate material made from slicing the solidified homogeneous crystal of claim 1, the substrate material having uniform properties throughout each substrate and from one substrate to another substrate.

4. Lithium niobate optical material produced by: a) preparing a charge of lithium niobate having a mol percentage composition of Li$_2$O of about 48.38 and the remainder Nb$_2$O$_5$, b) heating the charge to a temperature to provide a molten charge, and c) drawing a solidified homogeneous crystal from the molten charge having a composition essentially the same as that of the molten charge.

5. The optical material of claim 4, wherein the step of c) comprises pulling the solidified homogeneous crystal to obtain a solidification fraction for the homogeneous crystal corresponding to at least 0.85 of the molten charge.

6. Lithium niobate integrated optic substrate material made from slicing the solidified homogeneous crystal of claim 4, the substrate material comprising: a homogeneous composition of monocrystalline lithium niobate having uniform properties including a constant birefringence.

7. A process for making a lithium niobate crystal, comprising the steps of:
 preparing a molten charge having an Li$_2$O mole percentage composition of about 48.38, the remainder of the molten charge being Nb$_2$O$_5$; and
 solidifying the molten charge in substantially congruent fashion by drawing a substantially homogeneous lithium niobate crystal from the molten charge, the crystal having substantially the same composition as that of the molten charge.

8. The process of claim 7, in which at least 0.85 of the molten charge is solidified into a substantially homogeneous crystal.

9. The process of claim 7, in which at least 0.90 of the molten charge is solidified into a substantially homogeneous crystal.

10. The process of claim 7, in which the molten charge is an approximately four kilogram charge.

11. The process of claim 7, in which the substantially homogeneous crystal has a generally cylindrical shape approximately 8 cm. in diameter and approximately 13 cm. long.

12. The process of claim 7, in which essentially all of the molten charge is solidified into a substantially homogeneous crystal.

13. The process of claim 7, further comprising the step of dividing the homogeneous crystal into a plurality of slices, each slice comprising a substrate.

14. A homogeneous lithium niobate acoustic surface wave substrate prepared in accordance with the process of claim 13.

15. A homogeneous lithium niobate integrated optic substrate prepared in accordance with the process of claim 13.

16. A homogeneous lithium niobate crystal prepared in accordance with the process of claim 7.

* * * * *

UNITED STATES PATENT AND TRADEMARK OFFICE
CERTIFICATE OF CORRECTION

PATENT NO. : 5,310,448
DATED : May 10, 1994
INVENTOR(S) : BORDUI et al.

It is certified that error appears in the above-identified patent and that said Letters Patent is hereby corrected as shown below:

Cover Page
    Section [57] ABSTRACT

Line 12: delete "$Nb2_O5$" and insert --$Nb_2O_5$--

Signed and Sealed this

Thirteenth Day of December, 1994

Attest:

BRUCE LEHMAN

*Attesting Officer*     *Commissioner of Patents and Trademarks*